(12) United States Patent
Hung et al.

(10) Patent No.: US 7,772,921 B2
(45) Date of Patent: Aug. 10, 2010

(54) FILTER AND FILTERING METHOD

(75) Inventors: Yu-Lung Hung, Taipei (TW); Kang-Shou Chang, Taipei (TW)

(73) Assignee: Prolific Technology Inc., Taipei (TW)

( * ) Notice: Subject to any disclaimer, the term of this patent is extended or adjusted under 35 U.S.C. 154(b) by 0 days.

(21) Appl. No.: 12/357,352

(22) Filed: Jan. 21, 2009

(65) Prior Publication Data
US 2009/0189645 A1 Jul. 30, 2009

(30) Foreign Application Priority Data
Jan. 28, 2008  (TW) .............................. 97103168 A

(51) Int. Cl.
*H03K 5/00* (2006.01)
(52) U.S. Cl. ................ 327/551; 327/552; 327/34
(58) Field of Classification Search ............... 327/34, 327/337, 551–559, 50
See application file for complete search history.

(56) References Cited
U.S. PATENT DOCUMENTS 6,670,831 B2 * 12/2003 Mashimo ..................... 327/34
7,215,168 B2 * 5/2007 Takahashi et al. ............ 327/175
7,382,167 B1 * 6/2008 Umminger et al. ............ 327/76
7,411,427 B1 * 8/2008 Fong ........................... 327/34

* cited by examiner

*Primary Examiner*—Dinh T. Le
(74) *Attorney, Agent, or Firm*—Rabin & Berdo, P.C.

(57) ABSTRACT

A filter and a filtering method are provided. The filter includes a first compare voltage generation unit, a second compare voltage generation unit, a comparator and a first inverter. The first compare voltage generation unit generates a first compare voltage according to an input signal. The second compare voltage generation unit generates a second compare voltage. When the first compare voltage is not over the first reference voltage, the second compare voltage equals the first reference voltage. When the first compare voltage is over the first reference voltage, the second compare voltage equals the second reference voltage. The first reference voltage and the second reference voltage depend on a minimum pulse width. The comparator outputs a filtered signal according to the first compare voltage and the second compare voltage. The first inverter inverts a filtered signal to an output signal.

20 Claims, 5 Drawing Sheets

FILTER AND FILTERING METHOD

This application claims the benefit of Taiwan application Serial No. 97103168, filed Jan. 28, 2008, the subject matter of which is incorporated herein by reference.

BACKGROUND OF THE INVENTION

1. Field of the Invention

The invention relates in general to a filter, and more particularly to a filter enabling the pulse width of the input signal to be the same with that of the output signal without using an additional set of high frequency pulse.

2. Description of the Related Art

Many digital signal interfaces and universal serial buses (USB) have a specification regarding minimum pulse width and noise suppression to avoid the noise of an electronic system affecting the quality of digital signal and incurring erroneous actions. In prior art, such problem is resolved by using a first conventional filter or a second conventional filter.

First Conventional Filter:

Referring to FIG. 1, a first conventional filter is shown. The first conventional filter 10 includes an inverter 110, a resistor R and a capacitor C. The inverter 110 inverts the input signal Sin1 to an inverse input signal Sin1'. The inverse input signal Sin1' is filtered by the resistor R and the capacitor C and then outputted as an output signal Sout1.

However, the conventional filter 10 makes the overall signals decayed. As a result, the pulse width of the output signal Sout1 cannot maintain the same with that of the input signal Sin1.

Second Conventional Filter:

FIG. 2 of the US Patent No. US2007/0071085 discloses another conventional filter which filters the noise by receiving an additional set of high frequency pulse.

Currently, the electronic system is directed towards low power consumption, and most of the time, an electronic system would work on a stand-by mode or a sleep mode. An electronic system working on a stand-by mode or a sleep mode cannot provide high frequency pulse to the conventional filter to filter the noise.

SUMMARY OF THE INVENTION

The invention is directed to a filter, which enables the pulse width of the input signal to be the same with that of the output signal without using high frequency pulse.

According to a first aspect of the present invention, a filter is provided. The filter includes a first compare voltage generation unit, a second compare voltage generation unit, a comparator and a first inverter. The first compare voltage generation unit generates a first compare voltage according to an input signal. The second compare voltage generation unit generates a second compare voltage. When the first compare voltage is not over the first reference voltage, the second compare voltage equals the first reference voltage. When the first compare voltage is over the first reference voltage, the second compare voltage equals the second reference voltage. The first reference voltage and the second reference voltage depend on a minimum pulse width. The comparator outputs a filtered signal according to the first compare voltage and the second compare voltage. The first inverter inverts a filtered signal to an output signal.

According to a second aspect of the present invention, a filtering method. The filtering method includes the following steps. (a) A first compare voltage is generated according to an input signal. (b) A second compare voltage is generated, wherein the second compare voltage equals the first reference voltage when the first compare voltage is not over the first reference voltage, the second compare voltage equals the second reference voltage when the first compare voltage is over the first reference voltage, and the first reference voltage and the second reference voltage depend on a minimum pulse width. (c) A filtered signal is outputted according to the first compare voltage and the second compare voltage outputs. (d) A filtered signal is inverted to a filtered signal to an output signal.

The invention will become apparent from the following detailed description of the preferred but non-limiting embodiments. The following description is made with reference to the accompanying drawings.

DETAILED DESCRIPTION OF THE INVENTION

Figure 1:
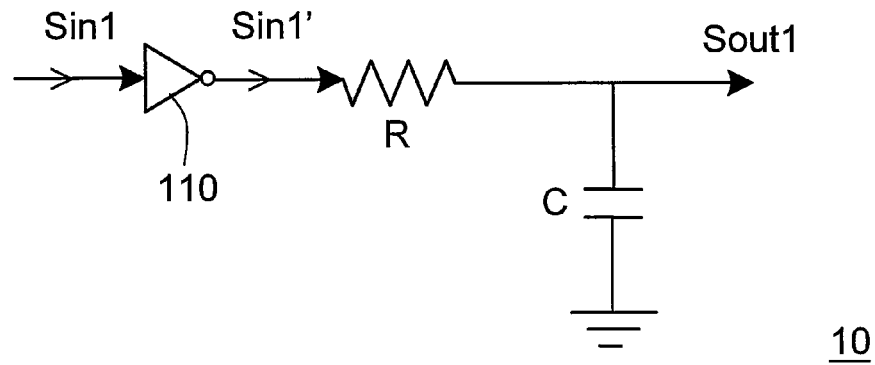
FIG. 1 (Prior Art) shows a first conventional filter.
Figure 2:
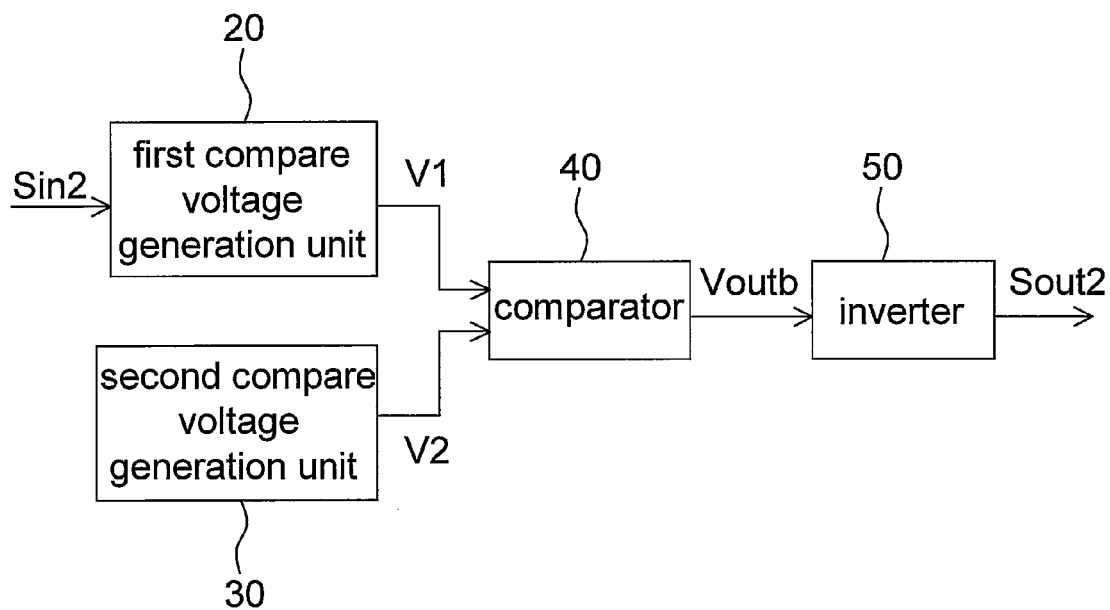
FIG. 2 shows a block diagram of a filter according to a preferred embodiment of the invention.

Circuit of Filter:

Referring to FIG. 2, a block diagram of a filter according to a preferred embodiment of the invention is shown. The filter 60 includes a first compare voltage generation unit 20, a second compare voltage generation unit 30, a comparator 40 and an inverter 50. The first compare voltage generation unit 20 generates a first compare voltage V1 according to an input signal Sin2. The second compare voltage generation unit 30 generates a second compare voltage V2.

When the first compare voltage V1 is not over the first reference voltage Vref1, the second compare voltage V2 equals the first reference voltage Vref1. When the first compare voltage V1 is over the first reference voltage Vref1, the second compare voltage V2 equals the second reference voltage Vref2. The first reference voltage Vref1 and the second reference voltage Vref2 depend on a minimum pulse width determined according to a digital signal interface or a universal serial bus (USB) such as an I2C.

The first compare voltage V1 and the second compare voltage V2 are respectively inputted to a non-inverse input end and an inverse input end of the comparator 40. The comparator 40 outputs a filtered signal Voutb according to the first compare voltage V1 and the second compare voltage V2. The inverter 50 receives the filtered signal Voutb and then inverts the filtered signal Voutb to an output signal Sout2.

Figure 3:
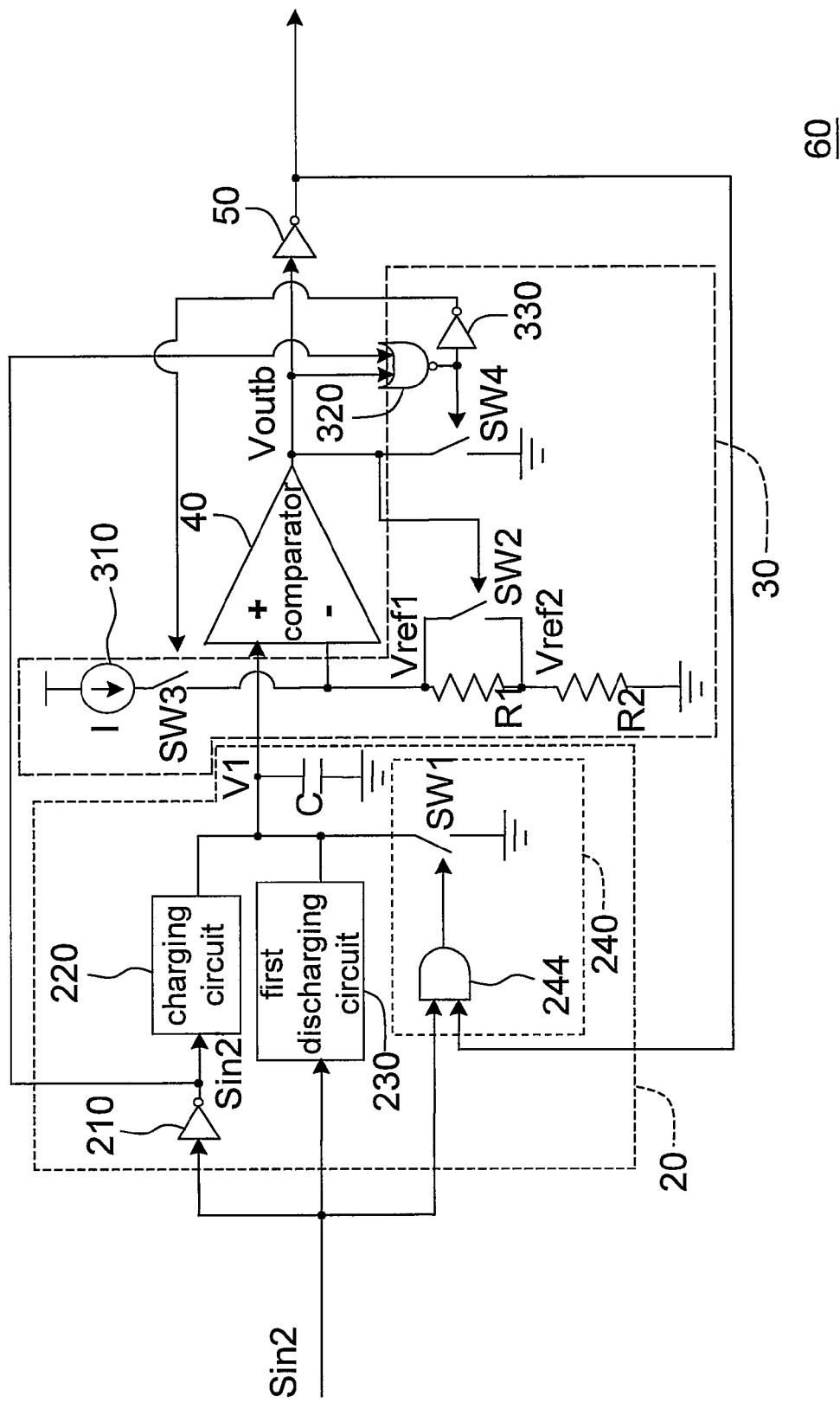
FIG. 3 shows a detailed circuit diagram of a filter 60.

Referring to FIG. 3, a detailed circuit diagram of a filter 60 is shown. The first compare voltage generation unit 20 further includes a capacitor C, inverter 210, a charging circuit 220, a first discharging circuit 230 and a second discharging circuit 240. The inverter 210 inverts the input signal Sin2 and then outputs an inverse input signal Sin2'.

The charging circuit 220 charges the capacitor C according to the inverse input signal Sin2'. When the inverse input signal Sin2' equals a high logic level, the first compare voltage V1 boosts as the capacitor C is charged. The high logic level is logic "1" for example.

The first discharging circuit 230 discharges the capacitor C according to an input signal Sin2. When the input signal Sin2 equals the high logic level, the first compare voltage V1 steps down as the capacitor C is discharged.

The second discharging circuit 240 further includes a switch SW1 and a logic gate 244. The switch SW1 and the capacitor C are connected in parallel. The logic gate 244 is an AND gate for example. The second discharging circuit 240 discharges the capacitor C according to an input signal Sin2 and the output signal Sout2. When the input signal Sin2 and output signal Sout2 equals the high logic level, the logic gate 244 turns on the switch SW1, such that the voltage stored in the capacitor C is discharged via the switch SW1, and the first compare voltage V1 plummets as the capacitor C is discharged.

The second compare voltage generation unit 30 further includes a current source 310, a resistor R1, a resistor R2, a switch SW2, a switch SW3, a switch SW4, an inverter 330 and a logic gate 320. The current source 310 is connected in serial with the switch SW3, the resistor R1 and the resistor R2, but is connected in parallel with the switch SW2 and the resistor R1. The switch SW3 is controlled by the filtered signal Voutb and the inverse input signal Sin2', so as to selectively and electrically connect the current source 310 to the resistor R1.

The logic gate 320 is an NOR gate for example. When the filtered signal Voutb and the inverse input signal Sin2' are both at a low logic level, the logic gate 320 outputs a high logic level. The inverter 330 inverts the high logic level to the low logic level to turn off the switch SW3. As the switch SW3 is turned off, the electrical connection between the current source 310 and the resistor R1 is cut off. Thus, under such a stable status, the filter 60 does not consume power, and power consumption can be thus saved.

To the contrary, if the filtered signal Voutb and the inverse input signal Sin2' are not both at a low logic level, the switch SW3 is turned on, such that the current source 310 and the resistor R1 are electrically connected. The current I provided by the current source 310 flows to the resistor R1 and the resistor R2 from the switch SW3 to generate a first reference voltage Vref1 used as the second compare voltage V2 (as indicated in FIG. 2).

The switch SW4 is also controlled by the filtered signal Voutb and the inverse input signal Sin2' to selectively and electrically connects the output end of the comparator 40 to a ground end. When the filtered signal Voutb and the inverse input signal Sin2' are both at a low logic level, the logic gate 320 turns on the switch SW4, such that the output end and the ground end of the comparator 40 are electrically connected. As the filtered signal Voutb equals the low logic level, the output signal Sout2 is set as the high logic level.

The switch SW2 controlled by the filtered signal Voutb is selectively turned on. When the first compare voltage V1 is larger than the first reference voltage Vref1, the filtered signal Voutb boosts to the high logic level from the low logic level, such that the switch SW2 is turned on. The current I provided by the current source 310 flows to the resistor R2 via the switch SW2 to generate a second reference voltage Vref2 used as the second compare voltage V2.

The filter 60 selectively works on a noise filtering mode or a signal passing mode according to an input signal Sin2. If the input signal Sin2 is interfered with by a noise, the filter 60 works on a noise filtering mode to filter the noise. If the input signal Sin2 is not interfered with by the noise, the filter 60 works on a signal passing mode such that the input signal Sin2 is unchanged, the input signal Sin2 passes through the filter 60 without distortion and then is outputted. The status of the filter 60 working on a noise filtering mode or a signal passing mode is further elaborated below.

Figure 4:
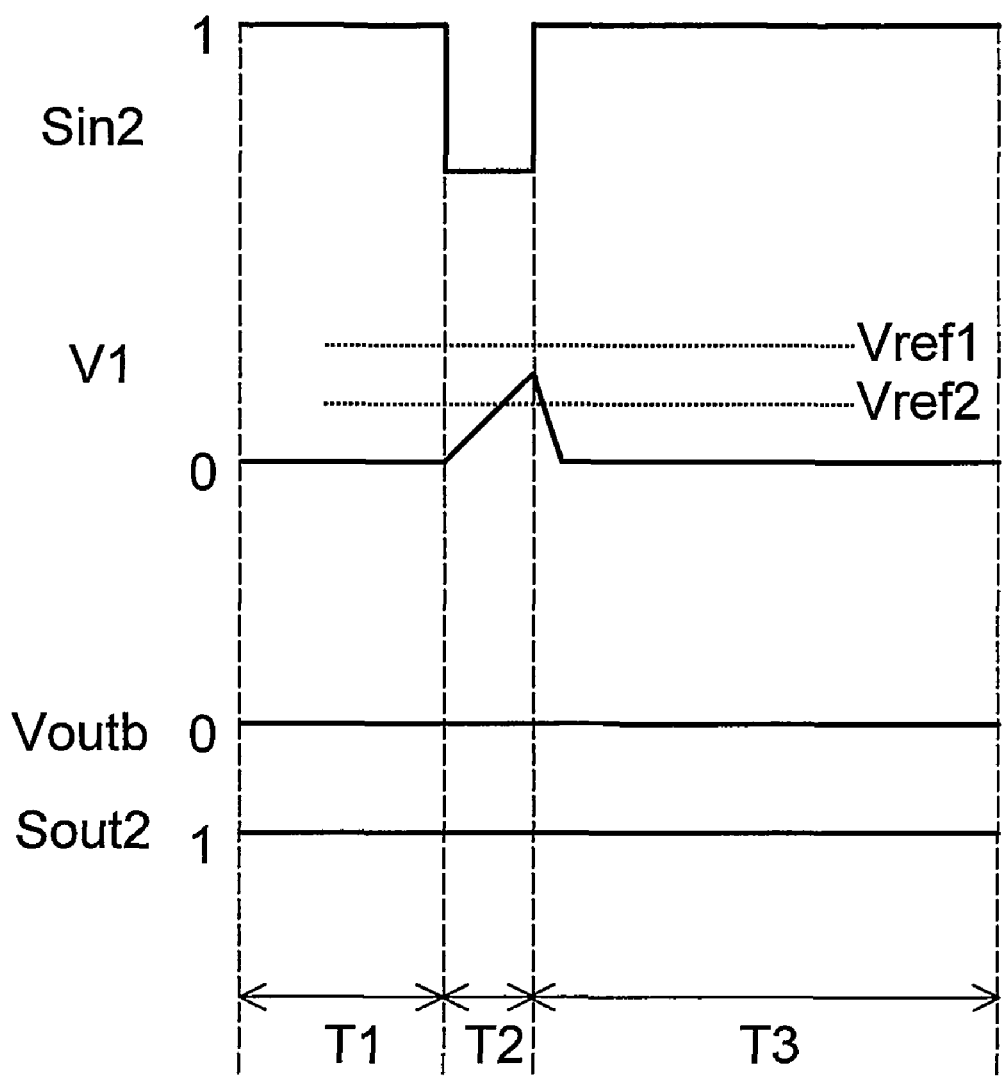
FIG. 4 shows a timing diagram of a filter 60 working on a noise filtering mode.

Timing of Noise Filtering Mode:

Referring to FIG. 3 and FIG. 4. FIG. 4 shows a timing diagram of a filter 60 working on a noise filtering mode. In FIG. 4, the input signal Sin2 is exemplified by an input signal interfered with by a noise, and the high logic level and the low logic level are exemplified by logic "1" and logic "0" respectively.

When the filter 60 works on a time period T1, the input signal Sin2 and the first compare voltage V1 are respectively equal to the high logic level and the low logic level, and the inverse input signal Sin2' equals the low logic level. During the time period, the logic gate 320 and the switch SW4 are controlled by the filtered signal Voutb and the inverse input signal Sin2', such that the filtered signal Voutb is forced to equal the low logic level and the output signal Sout2 is forced to equal the high logic level. Besides, the switch SW3 is controlled by the filtered signal Voutb and the inverse input signal Sin2' to be turned off, such that the power consumption of the filter 60 during the time period T1 is almost 0.

Afterwards, when the filter 60 works on a time period T2, the input signal Sin2 forms a noise pulse due to the interference of the noise, such that the input signal Sin2 steps down to the low logic level from the high logic level and the inverse input signal Sin2' equals the high logic level. The charging circuit 220 is controlled by the inverse input signal Sin2' and starts to charge the capacitor C, such that the first compare voltage V1 gradually boosts. As most of the noise pulse widths are within 50 n second, the first compare voltage V1 is not larger than the first reference voltage Vref1 during the time period T2. Thus, the filtered signal Voutb still equals the low logic level, such that the output signal Sout2 equals the high logic level.

Lastly, when the filter 60 works on a time period T3, the input signal Sin2 boosts to the high logic level from the low logic level. The first discharging circuit 230 is controlled by the input signal Sin2 to discharge the capacitor C, such that the first compare voltage V1 steps down to the low logic level. Besides, the second discharging circuit 240 is controlled by the input signal Sin2 and the output signal Sout2 to discharge the capacitor C to make the first compare voltage V1 step down faster. As the first compare voltage V1 is at a low logic level, the filtered signal Voutb still equals low logic level, such that the output signal Sout2 equals the high logic level.

Figure 5:
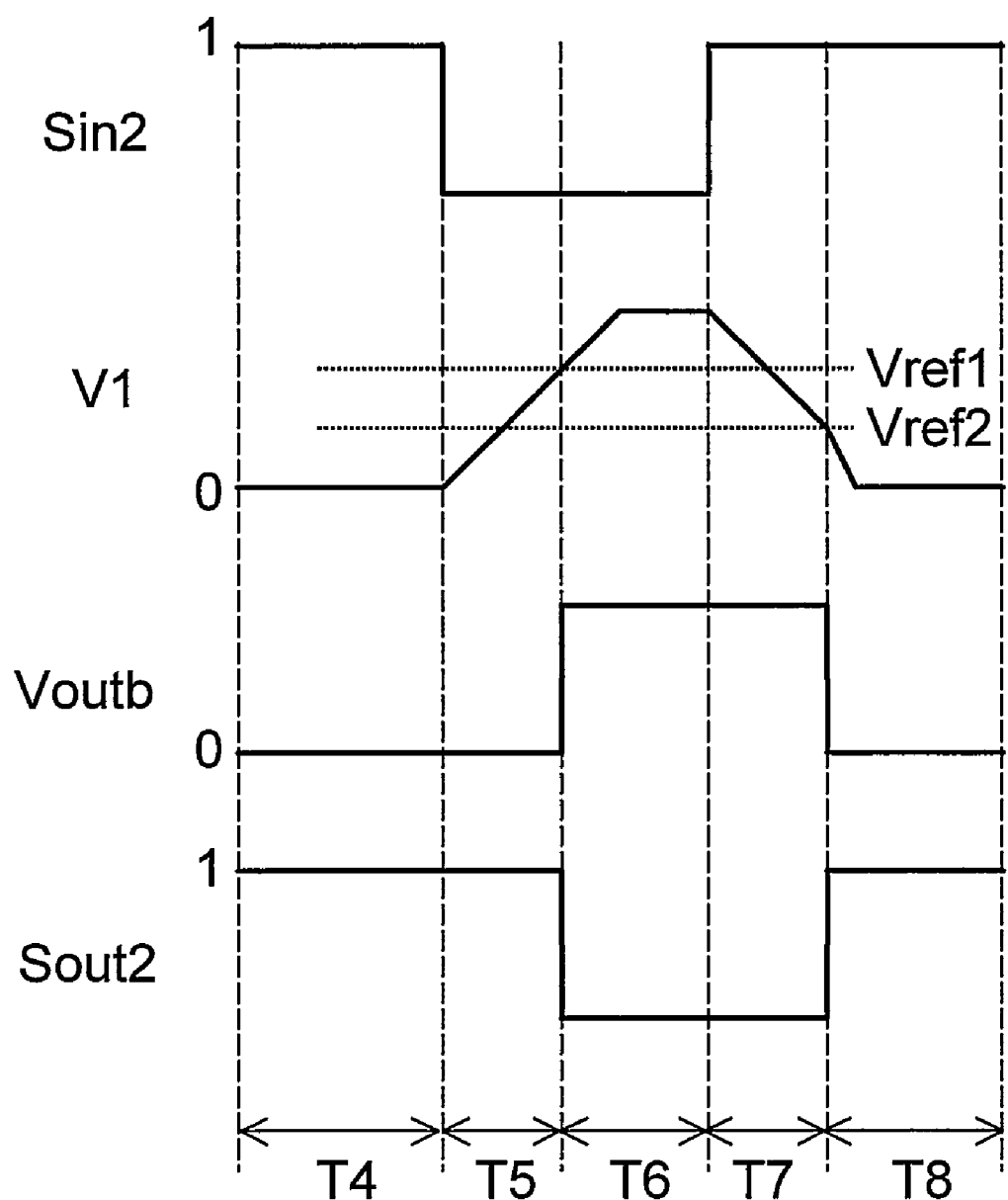
FIG. 5 shows a timing diagram of a filter 60 working on a signal passing mode.

Timing of Signal Passing Mode:

Referring to FIG. 3 and FIG. 5. FIG. 5 shows a timing diagram of a filter 60 working on a signal passing mode. In FIG. 5, the input signal Sin2 is exemplified by an input signal not interfered with by a noise, and the high logic level and the low logic level are exemplified by logic "1" and logic "0" respectively.

When the filter 60 works on a time period T4, the input signal Sin2 and the first compare voltage V1 are respectively equal to the high logic level and the low logic level, and the inverse input signal Sin2' equals the low logic level. During the time period, the logic gate 320 and the switch SW4 are controlled by the filtered signal Voutb and the inverse input signal Sin2', such that the filtered signal Voutb is forced to equal the low logic level and the output signal Sout2 is forced to equal the high logic level. Besides, the switch SW3 is controlled by the filtered signal Voutb and the inverse input signal Sin2' to be turned off, such that the power consumption of the filter 60 during the time period T4 is almost 0.

Afterwards, when the filter 60 works on a time period T5, the input signal Sin2 steps down to the low logic level from the high logic level and the inverse input signal Sin2' equals the high logic level. The charging circuit 220 is controlled by the inverse input signal Sin2' and starts to charge the capacitor C, such that the first compare voltage V1 gradually boosts. As the first compare voltage V1 is not larger than the first reference voltage Vref1 during the time period T5, the filtered signal Voutb still equals the low logic level, such that the output signal Sout2 equals the high logic level.

Next, when the filter 60 works on a time period T6, the input signal Sin2 still equals the low logic level, and the first compare voltage V1 is larger than the first reference voltage Vref1 because the charging circuit 220 continuously charges the capacitor C. As the first compare voltage V1 is larger than the first reference voltage Vref1, the filtered signal Voutb boosts to the high logic level from the low logic level, such that output signal Sout2 steps down to the low logic level from the high logic level. After the filtered signal Voutb boosts to the high logic level from the low logic level, the above second compare voltage V2 (as indicated in FIG. 2) changes to the second reference voltage Vref2 from the first reference voltage Vref1.

After that, when the filter 60 works at a time period T7, the input signal Sin2 boosts to the high logic level from the low logic level, and the first discharging circuit 230 is controlled by the input signal Sin2 and starts to discharge the capacitor C, such that the first compare voltage V1 gradually steps down. As the first compare voltage V1 is not smaller than the second reference voltage Vref2 during the time period T7, the filtered signal Voutb still equals the high logic level, such that the output signal Sout2 equals the low logic level.

Lastly, when the filter 60 works at a time period T8, the input signal Sin2 still equals the high logic level and the first compare voltage V1 is smaller than the second reference voltage Vref2 because the first discharging circuit 230 continuously discharges the capacitor C. As the first compare voltage V1 is smaller than the second reference voltage Vref2, the filtered signal Voutb steps down to the low logic level from the high logic level, such that output signal Sout2 boosts to the high logic level from the low logic level. During this time period, both the input signal Sin2 and the output signal Sout2 are at a high logic level, so the logic gate 244 turns on the switch SW1 to make the first compare voltage V1 step down faster.

The filter 60 can make the time period T5 equal the time period T7 by appropriately adjusting the charging circuit 220, the first discharging circuit 230, the first reference voltage Vref1 and the second reference voltage Vref2. Thus, the pulse width of the output signal Sout2 equals the pulse width of the input signal Sin2, such that the output signal Sout2 will not be distorted due to signal decay.

Figure 6:
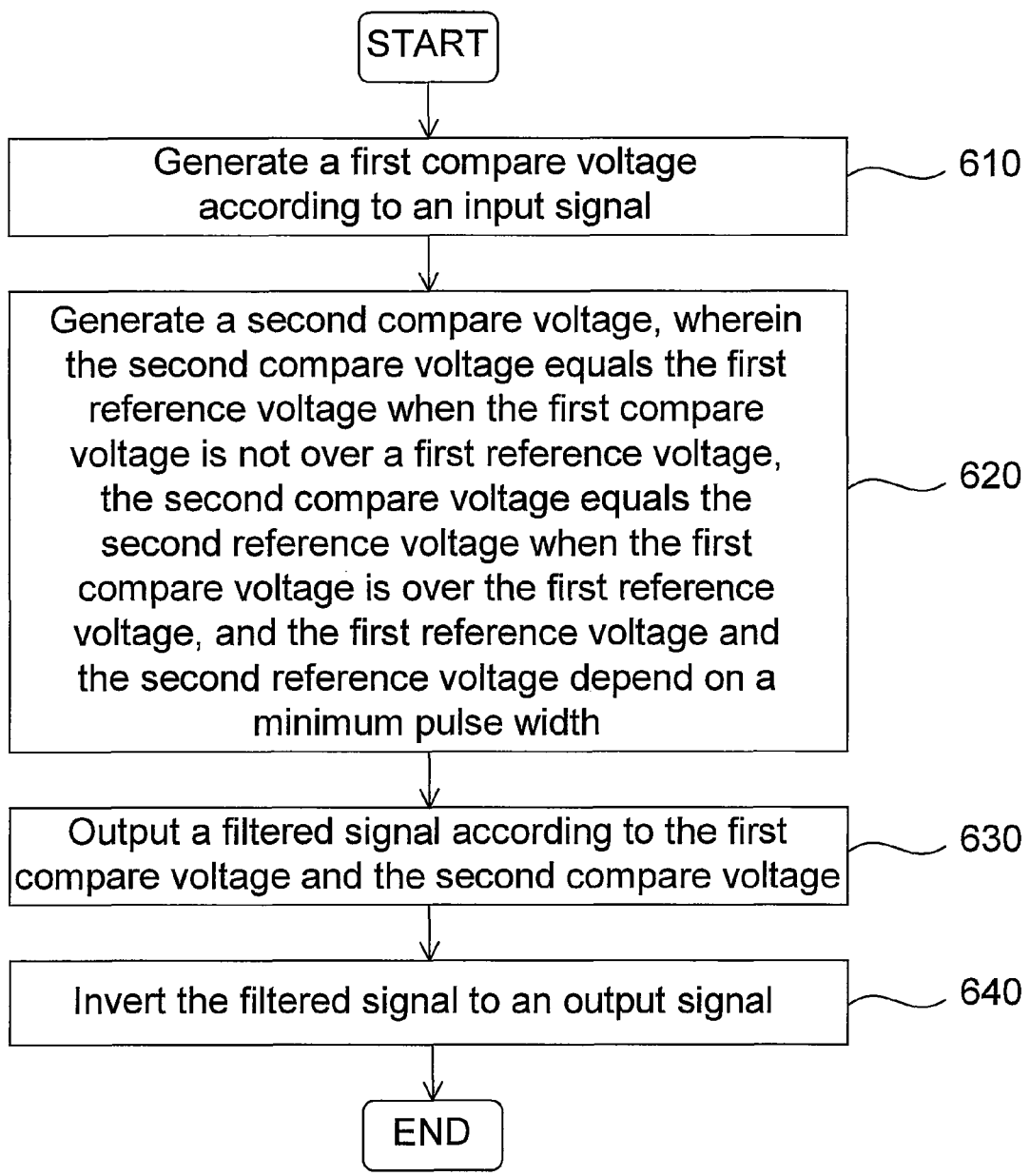
FIG. 6 shows a flowchart of a filtering method according to a preferred embodiment of the invention.

Filtering Method:

Referring to FIG. 2 and FIG. 6. FIG. 6 shows a flowchart of a filtering method according to a preferred embodiment of the invention. The filtering method applicable to the filter 60 includes the following steps. Firstly, the method begins at step 610, the first compare voltage generation unit 20 generates a first compare voltage V1 according to an input signal Sin2. Next, the method proceeds to step 620, the second compare voltage generation unit 30 generates a second compare voltage V2, wherein, the second compare voltage V2 equals the first reference voltage Vref1 when the first compare voltage V1 is not over the first reference voltage Vref1, the second compare voltage V2 equals the second reference voltage Vref2 when the first compare voltage V1 is over the first reference voltage Vref1, and the first reference voltage Vref1 and the second reference voltage Vref2 depend on a minimum pulse width. Then, the method proceeds to step 630, the comparator 40 outputs a filtered signal Voutb according to the first compare voltage Vref1 and the second compare voltage Vref2. Lastly, the method proceeds to step 640, the filtered signal Voutb is inverted to an output signal Sout2.

According to the filter and the filtering method disclosed in the above embodiments of the invention, the pulse width of the output signal is the same with that of the input signal without receiving a set of high frequency pulse. Regardless the electronic system works on a stand-by mode or a sleep mode, the filter and the filtering method disclosed in the above embodiments still filter noise and function normally.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A filter that filters an input signal to produce an output signal, comprising:
   a first compare voltage generation unit for generating a first compare voltage according to the input signal;
   a second compare voltage generation unit for generating a second compare voltage that equals a first reference voltage when the first compare voltage does not exceed the first reference voltage and equals a second reference voltage when the first compare voltage exceeds the first reference voltage;
   a comparator having a first input terminal and a second input terminal, coupled respectively to first and second voltage generation units for comparing the first compare voltage with the second compare voltage to produce at a comparator output a filtered signal according to the first compare voltage and the second compare voltage, wherein the second compare voltage generation unit includes
   a first resistor,
   a first switch connected in parallel with the first resistor and controlled by the filtered signal,
   a second resistor serially connected in with the first resistor,
   a current source,
   a second switch having an input switch terminal connected to the current source and an output switch terminal connected to the second input terminal of the comparator and grounded through the first and second resistors, the second switch controlled by the filtered signal or an inverse of the input signal so as selectively and electrically to connect the current source to the first resistor, wherein a current provided by the current source flows to the first resistor and the second resistor from the second switch to generate the first reference voltage, the current provided by the current source flows to the second resistor via the first switch to generate the second reference voltage, and
   a third switch having an input switch terminal connected to the comparator output and having an output switch terminal grounded, the third switch being controlled by the filtered signal or an inverse of the input signal so as selectively and electrically to connect the comparator output to a grounded terminal; and
   a first inverter, coupled to the comparator output for inverting the filtered signal to produce the output signal.

2. The filter according to claim 1, wherein the first compare voltage generation unit comprises:
   a capacitor;

a second inverter for inverting the input signal to produce an inverse input signal;

a charging circuit, coupled to the second inverter and the capacitor for charging the capacitor according to the inverse input signal; and a first discharging circuit, coupled to the capacitor for discharging the capacitor according to the input signal.

3. The filter according to claim 2, wherein the first compare voltage generation unit further comprises:

a second discharging circuit for discharging the capacitor according to the input signal and the output signal.

4. The filter according to claim 3, wherein the second discharging circuit comprises:

a fourth switch connected in parallel with the capacitor; and a logic gate, coupled to the fourth switch for controlling the fourth switch, wherein when the input signal and the output signal are both at a high logic level, the logic gate turns on the fourth switch, such that the capacitor is discharged via the fourth switch.

5. The filter according to claim 1, wherein the first switch is turned on when the filtered signal is at a high logic level.

6. The filter according to claim 1, wherein when either the filtered signal or the inverse input signal is at a high logic level, the second switch electrically connects the current source to the first resistor.

7. The filter according to claim 1, wherein when the filtered signal and the inverse input signal are both at a low logic level, the third switch electrically connects the comparator output to the ground terminal.

8. The filter according to claim 1, wherein the second compare voltage generation unit further comprises:

a logic gate, having a first input terminal and a second input terminal, coupled respectively to the comparator output and the second inverter for outputting at an output end a high logic level when the filtered signal and the inverse input signal are both at a low logic level; and a third inverter, coupled to the output end of the logic gate for inverting the high logic level to produce a low logic level to turn off the second switch, such that the second switch cuts off the electrical connection between the current source and the first resistor.

9. The filter according to claim 1, wherein the second compare voltage generation unit further comprises:

a logic gate, having a first input terminal and a second input terminal, coupled respectively to the comparator output and the second inverter, for turning on the third switch when the filtered signal and the inverse input signal are both at a low logic level, such that the third switch electrically connects the comparator output to the ground terminal.

10. The filter according to claim 1, wherein the filtered signal equals a low logic level when the input signal and the first compare voltage are respectively equal to a high logic level and a low logic level.

11. The filter according to claim 1, wherein the filtered signal equals a low logic level when the input signal equals a low logic level and the first compare voltage is not larger than the first reference voltage.

12. The filter according to claim 1, wherein the filtered signal equals a high logic level when the input signal equals a low logic level and the first compare voltage is larger than the first reference voltage.

13. The filter according to claim 1, wherein the filtered signal equals a high logic level when the input signal equals a high logic level and the first compare voltage is not smaller than the second reference voltage.

14. The filter according to claim 1, wherein the filtered signal equals a low logic level when the input signal equals a high logic level and the first compare voltage is smaller than the second reference voltage.

15. A filtering method for filtering an input signal to produce an output signal, comprising:

(a) generating a first compare voltage according to the input signal;

(b) generating a second compare voltage that equals a first reference voltage when the first compare voltage does not exceed the first reference voltage, and equals a second reference voltage when the first compare voltage exceeds the first reference voltage, wherein a current provided by a current source flows to a first resistor and a second resistor to generate the first reference voltage, and the current provided by the current source flows to the second resistor to generate the second reference voltage;

(c) outputting a filtered signal according to the first compare voltage and the second compare voltage; and (d) inverting the filtered signal to produce the output signal.

16. The filtering method according to claim 15, wherein in the step (c), the filtered signal equals a low logic level when the input signal and the first compare voltage are respectively equal to a high logic level and a low logic level.

17. The filtering method according to claim 15, wherein in the step (c), the filtered signal equals a low logic level when the input signal equals a low logic level and the first compare voltage is not larger than the first reference voltage.

18. The filtering method according to claim 15, wherein in the step (c), the filtered signal equals a high logic level when the input signal equals a low logic level and the first compare voltage is larger than the first reference voltage.

19. The filtering method according to claim 15, wherein in the step (c), the filtered signal equals a high logic level when the input signal equals a high logic level and the first compare voltage is not smaller than the second reference voltage.

20. The filtering method according to claim 15, wherein in the step (c), the filtered signal equals a low logic level when the input signal equals a high logic level and the first compare voltage is smaller than the second reference voltage.

* * * * *